(12) United States Patent  
Richter

(10) Patent No.: US 6,515,495 B2
(45) Date of Patent: Feb. 4, 2003

(54) TEST STRUCTURE IN AN INTEGRATED SEMICONDUCTOR

(75) Inventor: Frank Richter, Dresden (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/793,353

(22) Filed: Feb. 26, 2001

(65) Prior Publication Data

US 2001/0022360 A1 Sep. 20, 2001

(30) Foreign Application Priority Data

Feb. 25, 2000 (DE) ......................................... 100 10 285

(51) Int. Cl.$^7$ .............................................. G01R 31/02
(52) U.S. Cl. ...................... 324/754; 324/765; 324/763
(58) Field of Search ................................. 324/754, 765, 324/73.1, 537, 763, 768, 769, 158.1; 438/17, 18, 466; 257/48, 207, 208, 920

(56) References Cited

U.S. PATENT DOCUMENTS 4,288,911 A * 9/1981 Ports ........................... 438/17
4,961,053 A * 10/1990 Krug ........................... 324/537
5,942,766 A    8/1999 Frei
6,177,733 B1 * 1/2001 Obara .......................... 257/48

FOREIGN PATENT DOCUMENTS

EP          0 133 955 A1        3/1985

* cited by examiner

*Primary Examiner*—Michael Sherry
*Assistant Examiner*—Minh N. Tang
(74) *Attorney, Agent, or Firm*—Laurence A. Greenberg; Werner H. Stemer; Ralph E. Locher

(57) ABSTRACT

With increasing integration density of integrated circuits, the packing density in test regions (kerf structures) located between the integrated circuits cannot be increased substantially, since the majority of the available area is occupied by contact areas. The invention is therefore directed toward a test structure region on a wafer having contact areas for applying voltages and test components between the contact areas. The test structure includes at least two test components that are arranged between two adjacent contact areas. The test components are each connected to the adjacent contact areas so that a voltage can be applied to the test components via the contact areas.

5 Claims, 3 Drawing Sheets

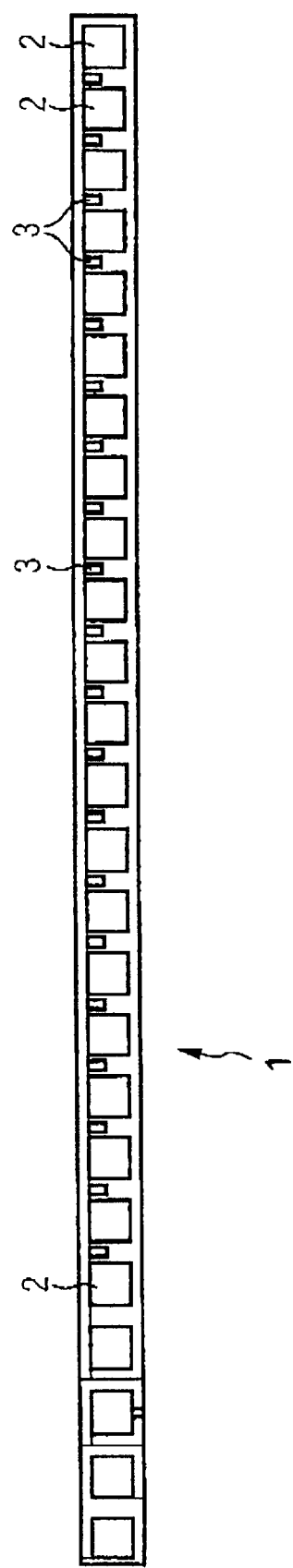

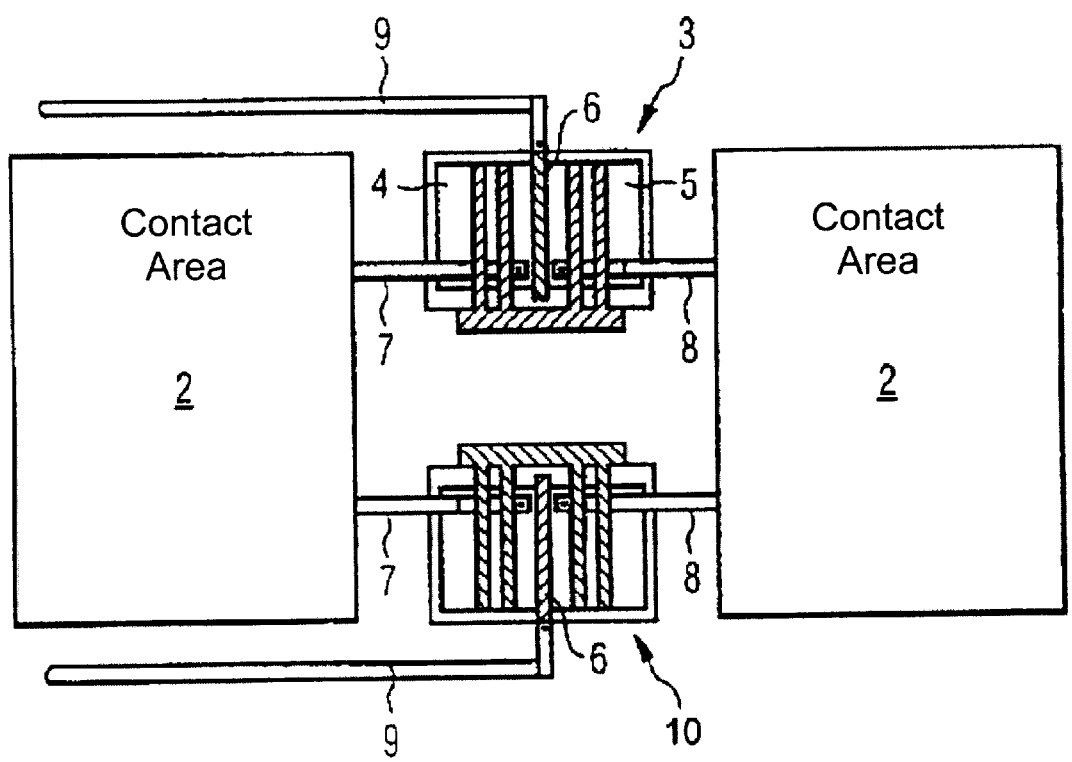

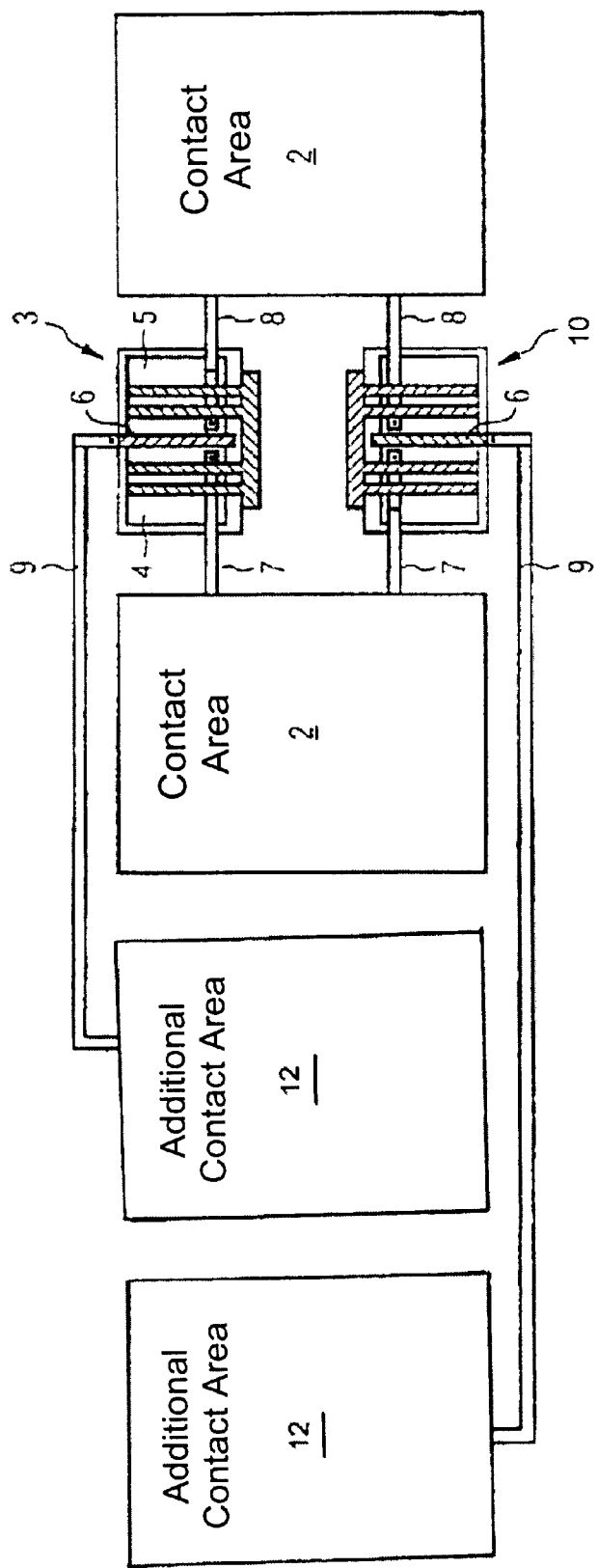

TEST STRUCTURE IN AN INTEGRATED SEMICONDUCTOR

BACKGROUND OF THE INVENTION

Field of the Invention

The present invention relates to a test structure region on a wafer and, in particular to a test structure region which can be arranged between two integrated circuits on a wafer.

Integrated circuits are produced on monocrystaline silicon discs, so-called wafers. Since the area available on a wafer is considerably larger than the area of an integrated circuit, a plurality of integrated circuits, which for the most part are identical, are accommodated on each wafer produced. During the production of integrated circuits, photolithographic processes are used repeatedly, in which the wafer is exposed through a mask. By means of this illumination operation, for example, structures belonging to the integrated circuit and that are to be etched out are defined in a photoresist. For rationalization reasons, for the most part a number of masks for a number of integrated circuits located beside one another are arranged on a lithographic film and exposed together. The integrated circuits exposed together in this way are referred to as a reticle. Between the individual integrated circuits there is an interspace, in which the finished integrated circuits can be separated from one another by sawing or etching. The interspace is removed chemically or mechanically.

However, before the separation operation, the interspace is used for test purposes by test structures that are provided on the coherent masks for producing a reticle. The test structures between the actual regions of the integrated circuits are exposed at the same time and fill up the interspace between the individual integrated circuits.

These test structures normally comprise contact areas (so-called pads) and test components, mostly transistors, which are arranged between the contact areas. A test component in each case is located between two contact areas.

Following the production of the integrated circuits on a wafer, contact can be made with these test regions and the operability of the test components arranged on them, for example the transistors, can be checked. The operability of the transistors supplies a quite reliable image of the quality of the production process of the integrated circuits on the respective wafer. It can be assumed that problems which manifest themselves in the test regions are also present in the integrated circuits, so that the latter can be separated out early, before their unoperability is established in a significantly more complicated test process that follows this general test.

With increasing integration density of the integrated circuits, in particular in the case of memory components such as DRAM (Dynamic Random Access Memory), SDRAM (Synchronous Dynamic Random Access Memory), RAMBUS, or EDRAM (Enhanced Dynamic Random Access Memory), however, the problem arises that an ever increasing number of functional elements are arranged on a specific area of the wafer. In contrast, the packing density in the test regions located between the integrated circuits cannot be increased substantially, since the majority of the area which is available is occupied by the contact areas, whose size can not be practically reduced. Therefore, with increasing integration density, the ratio between the number of test components and the number of functional components decreases. This decrease in the number of testable individual structures, and the associated loss of information, in particular in developing and in starting production of a new product, was tolerated in the prior art, but was unsatisfactory to a high degree.

Published European Patent Application EP 0 133 955 A1 shows a test structure for identifying semiconductor chips, in which parallel-connected components are provided between two connection areas. Following a test, one or more of the components is severed in order to identify the semiconductor chip. Use may be made of connection areas which are not accessible during normal operation. A threshold switch, for example a thick oxide transistor, prevents the test structure from having any influence on the otherwise connected circuit parts of the semiconductor chip.

U.S. Pat. No. 5,942,766 shows a different test structure for measuring RF parameters of integrated circuits arranged on a wafer. The test structures are arranged between the integrated circuits. They each comprise a connection area which serves as an input, output, or ground for the test element.

SUMMARY OF THE INVENTION

It is accordingly an object of the invention to provide a test structure region on a wafer which overcomes the above-mentioned disadvantageous of the prior art apparatus of this general type, and which, in particular, provides an increased number of testable individual structures, or test components relative to the chip area of the integrated circuits.

With the foregoing and other objects in view there is provided, in accordance with the invention a test structure that includes a wafer, or a test structure region having a plurality of sets of at least two transistors. Each one of the at least two transistors of the plurality of the sets defines a test component. The test structure includes a plurality of contact areas disposed on the wafer. The at least two transistors of each one of the plurality of the sets are disposed between and are connected to a respective pair of adjacent ones of the plurality of the contact areas for receiving a voltage that can be applied to the respective pair of adjacent ones of the plurality of the contact areas. The test structure also includes a plurality of additional contact areas disposed on the wafer. One of the at least two transistors of each one of the plurality of the sets includes a gate connection connected to a respective one of the plurality of the additional contact areas for receiving a switching current. Another one of the at least two transistors of each one of the plurality of the sets includes a gate connection connected to an area selected from the group consisting of the respective one of the plurality of the additional contact areas for receiving the switching current and another respective one of the plurality of the additional contact areas for receiving another switching current such that the at least two transistors of each one of the sets can be switched on alternately from each other.

In other words, the invention provides a test structure region on a wafer having contact areas for applying voltages and test components between the contact areas, in this test structure region at least two test components are arranged between two adjacent contact areas in each case and being connected to the adjacent contact areas, so that a voltage can be applied to the test components via the contact areas.

The gate connections of the transistors are connected to further contact areas in order to supply a switching current. As a result, the gate connections of the transistors can be driven independently of one another, and the transistors can be tested independently of one another.

This increases the number of testable test components between the contact areas. Hitherto, it was assumed that it was only expedient to place one test component between two contact areas in each case.

The test components are transistors. These can, for example, be connected by their source regions to one adjacent contact area and by drain regions to the other adjacent contact area.

The gate regions can, for example, also run via a common pole 20 which, during the testing of the test structure region, can be switched on and off via special contact areas provided for the purpose.

In accordance with an added feature of the invention, the gate connections of the transistors can be driven separately from one another, in order to change over alternately between the transistors by a respective current pulse. The gate connections are each connected via a corresponding line to a respective further contact area.

As already explained, the invention is preferably directed toward test structure regions which are arranged between two integrated circuits. However, the invention is also suitable for providing test structure regions in other regions of integrated circuits and, in particular in regions that are not removed after the test. In particular in the case of highly complex chips, for example processors, which occupy a comparatively large chip area, it may be expedient to provide test structure regions of the type according to the invention in the interior of each chip area as well.

In accordance with a concomitant feature of the invention, the test structure region can preferably have a width of 50 to 200 $\mu$m. The width is determined critically by the size of the contact areas, which may be arranged in a row, and which define the width of the space available for the arrangement of test components.

Other features which are considered as characteristic for the invention are set forth in the appended claims.

Although the invention is illustrated and described herein as embodied in a test structure in an integrated semiconductor, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 shows a general view of an overall test structure region known in the prior art;

FIG. 2 shows test transistors configured between contact areas of a test structure region according to the invention; and FIG. 3 shows additional contact areas for independently providing control signals to the test transistors.

DESCRIPTION OF THE PREFERRED EMBODIMENTS

Referring now to the figures of the drawing in detail and first, particularly, to FIG. 1 thereof, there is shown a test structure region 1, over whose length contact areas 2 are distributed. The test structure region 1 is located in the sawing frame, the so-called kerf, between two integrated circuits on a semiconductor wafer. After the test, the semiconductor circuits are sawn up along the sawing frame and as a result are separated. The contact areas are spaced apart from one another. Arranged in the interspace between two adjacent contact areas in each case are test components 3, for example transistors. These are connected by their source/drain regions to two adjacent contact areas in each case. At the same time, each contact area is also connected to two adjacent transistors, so that each contact area can be used alternately as a voltage generator for a source region or a drain region. During the testing of the test structure region, the voltages have to be applied accordingly to the test pins.

FIG. 2 shows an inventive configuration of two test transistors 3, 10 that are between contact areas 2. However, it is also conceivable to increase the number of transistors further. Each transistor 3, 10 has a source region 4 and a drain region 5 and also a gate region 6. The source region 4 is connected via a conductor track 7 to the left-hand of the two contact areas 2, while the drain region 5 is connected via a conductor track 8 to the right-hand of the two contact areas 2. Each of the two transistors 3, 10 are configured in identical circuits. It is also conceivable to design the transistors 3, 10 such that they have common source/drain or gate regions. The implementation of such common regions is known to those skilled in the art. The conductor tracks 9 are arranged on the gate region 6 and lead to contact areas (not illustrated) via which a switching current can be fed to the transistors.

FIG. 3 shows an embodiment, in which the two transistors 3, 10 of the test structure regions can be alternately switched on. For example, the upper transistor 3 is switched on via a switching current fed to the gate connection 6 on its gate line 9, so that it can be tested via the contact areas 2, 2 arranged on the right and left. In this case, the lower transistor 10 is then switched off. In the other setting, the lower transistor 10 can be switched on via a corresponding switching current fed to its gate connection 6 via the line 9, while the upper transistor 3 is switched off. The characteristics of the lower transistor 10 can then be tested. This means that both transistors 3, 10 can be activated alternately for test purposes. This includes both transistors 3, 10 also being switched on simultaneously and tested in parallel.

For the mutually independent control of the upper and the lower transistors 3, 10 shown in FIG. 3, separate additional contact areas or connection pads 12 comparable to the connection pads 2 shown are provided. These pads 12 are arranged to the left of the left-hand contact area 2 shown in FIG. 3. One of these additional pads 12 is connected to the upper conductor track 9 and the other of the additional pads 12 is connected to the lower conductor track 9 as shown in FIG. 3. It is therefore possible for the two transistors 3, 10 to be fed with appropriate control signals independently of each other, in order to switch the transistors 3, 10 on or off completely independently of each other or to drive them in accordance with the desired test. This includes both transistors 3, 10 also being driven in parallel with the same signal.

The achievement leads to optimum utilization of the existing intermediate regions (the so-called kerf regions). At the same time, there is a massive reduction in the necessary macro regions. A reduction in the pad geometries as known in the prior art in order to compensate for a lack of test areas is no longer necessary. The fact that no new equipment has to be provided leads to a significant saving in investments. Overall, optimum device development can be secured for future shrink generations and new SDRAM and EDRAM products by preventing cuts in important transistor structures caused by a lack of space.

I claim:

1. A test structure, comprising:

a wafer having a plurality of sets of at least two transistors, each one of said at least two transistors of said plurality of said sets defining a test component;

a plurality of contact areas disposed on said wafer, said at least two transistors of each one of said plurality of said sets disposed between and connected to a respective pair of adjacent ones of said plurality of said contact areas for receiving a voltage that can be applied to said respective pair of adjacent ones of said plurality of said contact areas;

a plurality of additional contact areas disposed on said wafer;

one of said at least two transistors of each one of said plurality of said sets including a gate connection connected to a respective one of said plurality of said additional contact areas for receiving a switching current; and another one of said at least two transistors of each one of said plurality of said sets including a gate connection connected to another respective one of said plurality of said additional contact areas for receiving another switching current such that said at least two transistors of each one of said sets can be switched on alternately from each other.

2. The test structure according to claim 1, wherein each one of said at least two transistors of each one of said sets includes a source region connected to one of said respective pair of adjacent ones of said plurality of said contact areas and a drain region connected to another one of said respective pair of adjacent ones of said plurality of said contact areas.

3. The test structure according to claim 1, comprising a region disposed on said wafer that has a width of 50 to 200 micrometers and that includes said plurality of said sets of said at least two transistors, said plurality of said contact areas, and said plurality of said additional contact areas.

4. The test structure according to claim 1, wherein said other one of said at least two transistors of each one of said sets is connected to said other respective one of said plurality of said additional contact areas for receiving the other switching current such that said at least two transistors of each one of said plurality of said sets can be switched on alternately from each other.

5. In combination with a wafer having two integrated circuits disposed thereon, a test structure disposed between said two integrated circuits, the test structure, comprising:

a plurality of sets of at least two transistors disposed on a wafer, each one of said at least two transistors of said plurality of said sets defining a test component;

a plurality of contact areas disposed on said wafer, said at least two transistors of each one of said plurality of said sets disposed between and connected to a respective pair of adjacent ones of said plurality of said contact areas for receiving a voltage that can be applied to said respective pair of adjacent ones of said plurality of said contact areas;

a plurality of additional contact areas disposed on said wafer;

one of said at least two transistors of each one of said plurality of said sets including a gate connection connected to a respective one of said plurality of said additional contact areas for receiving a switching current;

another one of said at least two transistors of each one of said plurality of said sets including a gate connection connected to another respective one of said plurality of said additional contact areas for receiving another switching current such that said at least two transistors of each one of said sets can be switched on alternately from each other.

* * * * *